United States Patent
Nguyen

(10) Patent No.: US 8,803,588 B2
(45) Date of Patent: *Aug. 12, 2014

(54) TEMPERATURE COMPENSATION CIRCUIT

(71) Applicant: Intel IP Corporation, Santa Clara, CA (US)

(72) Inventor: Darin Dung Nguyen, Phoenix, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/971,025

(22) Filed: Aug. 20, 2013

(65) Prior Publication Data

US 2013/0335136 A1 Dec. 19, 2013

Related U.S. Application Data

(63) Continuation of application No. 13/181,287, filed on Jul. 12, 2011, now Pat. No. 8,536,932.

(51) Int. Cl.
G05F 3/26 (2006.01)
G05F 3/30 (2006.01)
H03L 7/099 (2006.01)

(52) U.S. Cl.
USPC ........... 327/513; 327/539; 323/316; 323/907; 331/176

(58) Field of Classification Search
None
See application file for complete search history.

(56) References Cited

U.S. PATENT DOCUMENTS

| | | | | |
|---|---|---|---|---|
| 6,181,191 B1 * | 1/2001 | Paschal | | 327/513 |
| 6,265,857 B1 * | 7/2001 | Demsky et al. | | 323/312 |
| 7,323,857 B2 | 1/2008 | Sung | | |
| 7,570,107 B2 * | 8/2009 | Kim et al. | | 327/539 |
| 7,696,909 B2 * | 4/2010 | Oberhuber | | 341/119 |
| 7,728,575 B1 | 6/2010 | Ozalevli et al. | | |
| 7,777,558 B2 * | 8/2010 | Chen | | 327/539 |
| 7,888,987 B2 * | 2/2011 | Horie | | 327/513 |
| 8,258,854 B2 | 9/2012 | Pan | | |
| 8,283,609 B2 * | 10/2012 | Jeong | | 219/512 |
| 2008/0150641 A1 | 6/2008 | Costa et al. | | |

* cited by examiner

*Primary Examiner* — Lincoln Donovan
*Assistant Examiner* — Terry L Englund
(74) *Attorney, Agent, or Firm* — Baker Botts L.L.P.

(57) ABSTRACT

A temperature compensation circuit is disclosed. A temperature compensation circuit may include a temperature coefficient generator configured to generate a first signal and a second signal, wherein the first signal is proportional-to-absolute-temperature (ptat) and the second signal is negatively-proportional-to-absolute-temperature (ntat), a first programmable element configured to multiply at a first programmable ratio an amplitude of a third signal having a negative temperature coefficient from a first temperature to a second temperature, and a second programmable element configured to multiply at a second programmable ratio an amplitude of a fourth signal having a positive temperature coefficient from the second temperature to a third temperature.

20 Claims, 7 Drawing Sheets

TEMPERATURE COMPENSATION CIRCUIT

CROSS-REFERENCE TO RELATED APPLICATIONS

This application is a continuation of pending U.S. patent application Ser. No. 13/181,287 filed Jul. 12, 2011, now U.S. Pat. No. 8,536,932 issued Sep. 17, 2013; the contents of which is incorporated herewith in its entirety by reference.

TECHNICAL FIELD

The present disclosure relates generally to electronic circuits and, more particularly, to temperature compensation for electronic circuits.

BACKGROUND

Integrated circuits may be required to perform across a range of temperatures. Various devices in an integrated circuit, including, but not limited to, transistors, resistors, and capacitors may have performance parameters that vary across a range of temperatures. Accordingly, the performance of circuits that comprise such devices may also vary across a range of temperatures. To improve accuracy over a range of temperatures, a circuit may be designed to include temperature compensation that offsets the variation that the circuit would otherwise experience across a range of temperatures.

SUMMARY

In accordance with some embodiments of the present disclosure, a temperature compensation circuit may comprise a temperature coefficient generator configured to generate a first signal and a second signal, wherein the first signal is proportional-to-absolute-temperature (ptat) and the second signal is negatively-proportional-to-absolute-temperature (ntat), a first programmable element configured to multiply at a first programmable ratio an amplitude of a third signal having a negative temperature coefficient from a first temperature to a second temperature, and a second programmable element configured to multiply at a second programmable ratio an amplitude of a fourth signal having a positive temperature coefficient from the second temperature to a third temperature.

Technical advantages of the present disclosure may be readily apparent to one skilled in the art from the figures, description and claims included herein.

DETAILED DESCRIPTION

Figure 1:
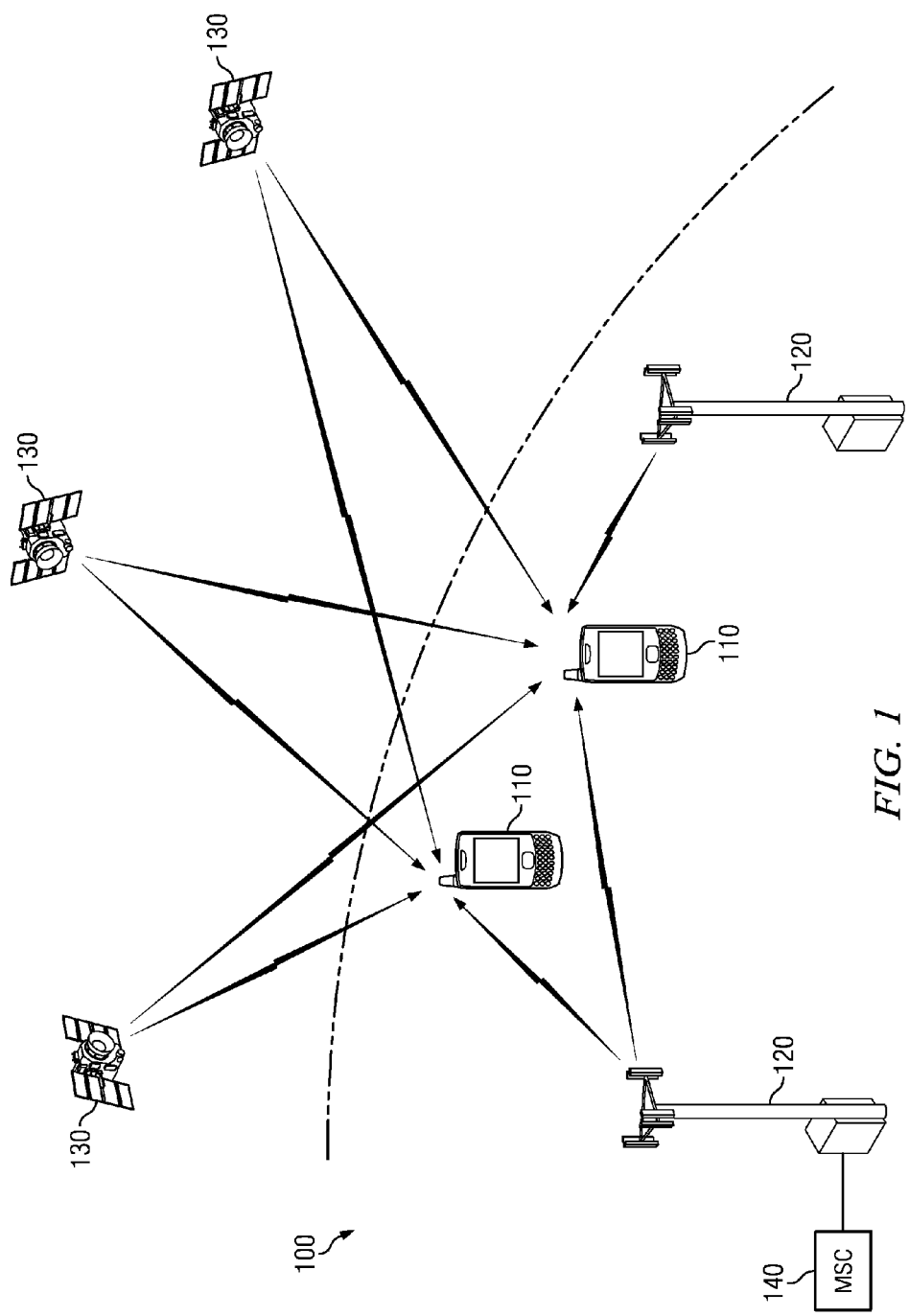
FIG. 1 depicts a block diagram of an example wireless communication system, in accordance with certain embodiments of the present disclosure.

FIG. 1 depicts a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
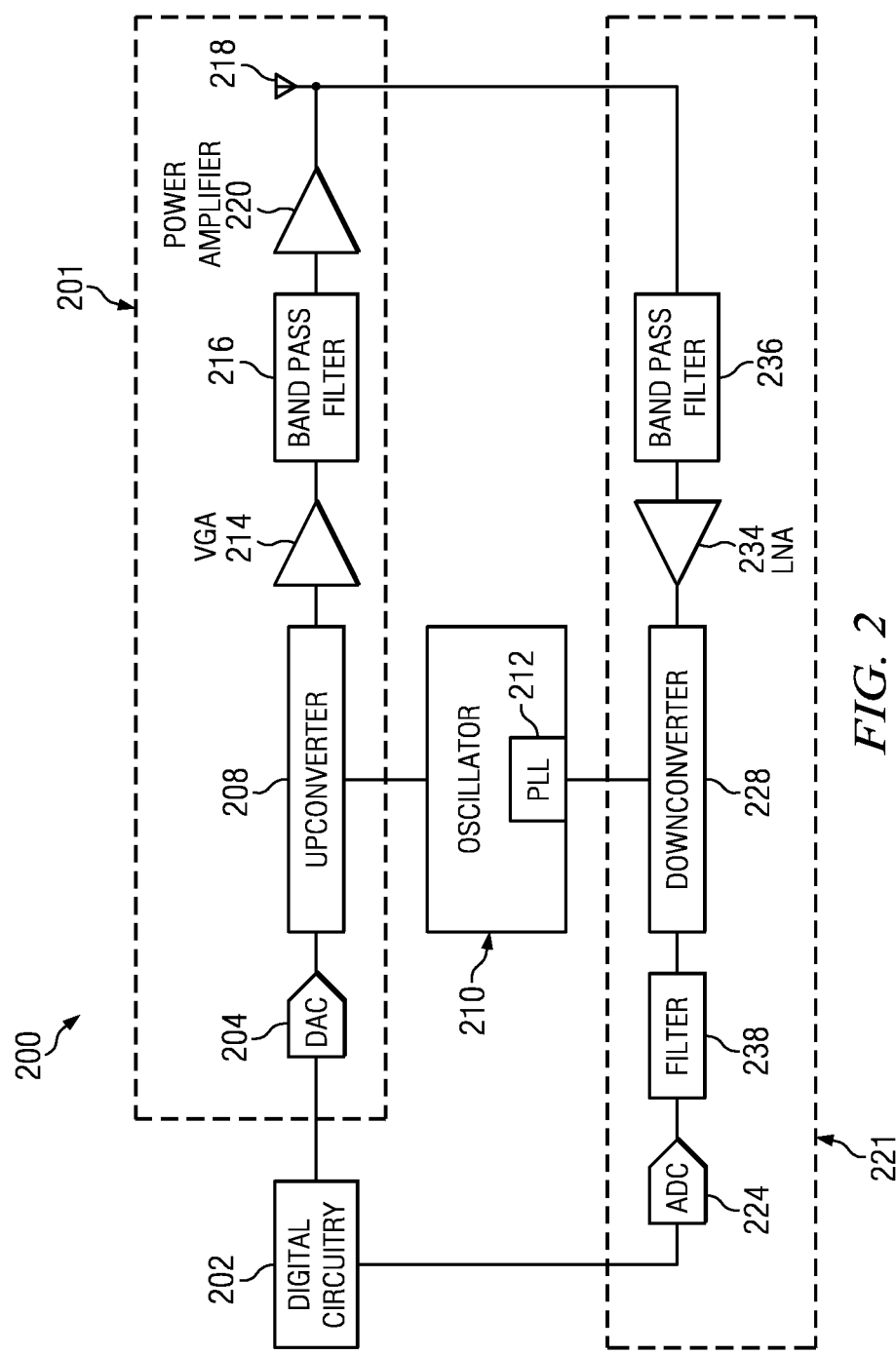
FIG. 2 depicts a block diagram of selected components of an example transmitting and/or receiving element, in accordance with certain embodiments of the present disclosure.

FIG. 2 depicts a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

As shown in FIG. 2, oscillator may include a phase-locked loop (PLL) 212. PLL 212 may be a control system configured to generate a signal that has a fixed relation to the phase of a "reference" input signal by responding to both the frequency and the phase of the input signal, and automatically raising or lowering the frequency of a controlled oscillator until it is matched to the reference in both frequency and phase. PLL 212 may be described in greater detail below with reference to FIG. 3.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 234 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3:
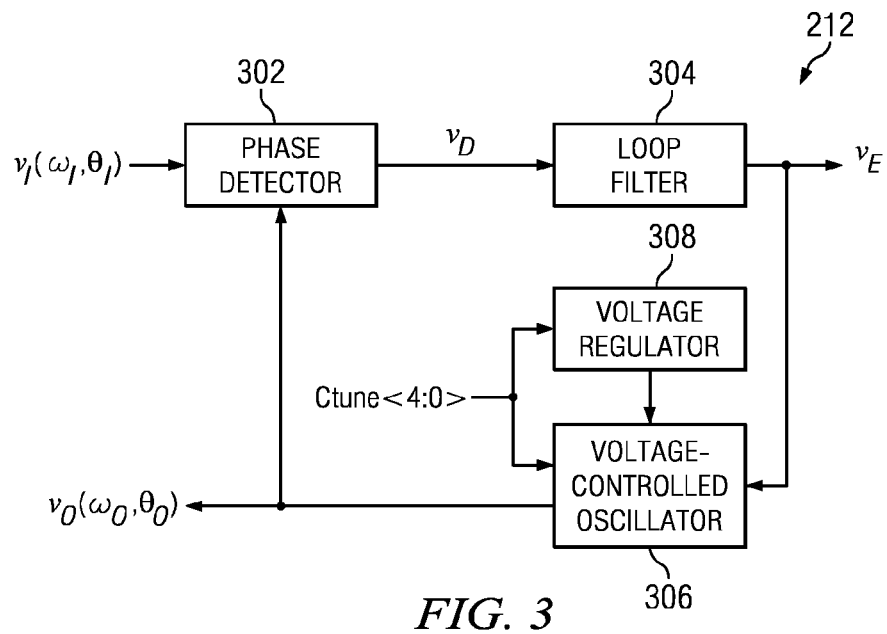
FIG. 3 depicts a block diagram of a phase locked loop (PLL), in accordance with certain embodiments of the present disclosure.

FIG. 3 depicts a block diagram of PLL 212, in accordance with certain embodiments of the present disclosure. PLL 212 may be a frequency-selective circuit designed to synchronize an incoming signal, $v_I(\omega_I, \theta_I)$ and maintain synchronization in spite of noise or variations in the incoming signal frequency. As depicted in FIG. 3, PLL 212 may comprise a phase detector 302, a loop filter 304, a voltage-controlled oscillator (VCO) 306, and a voltage regulator 308.

Phase detector 302 may be configured to compare the phase $\theta_I$ of the incoming reference signal $v_I$ to the phase $\theta_O$ of the VCO 306 output $v_O$, and produce a voltage $v_D$ proportional to the difference $\theta_I - \theta_O$. In some embodiments, phase detector 302 may include a frequency divider that may divide the frequency of the VCO 306 output before comparing the phase $\theta_I$ of the incoming reference signal $v_I$ to the phase $\theta_O$ of the VCO 306 output $v_O$. Voltage $v_D$ may be filtered by loop filter 304 to suppress high-frequency ripple and noise, and the result, called the error voltage $v_E$, may be applied to a control input of VCO 306 to adjust its frequency $\omega_{vco}$. VCO 306 may be configured such that with $v_E=0$ it is oscillating at some initial frequency $\omega_0$, known as the free-running frequency, so that the characteristic of VCO 306 is:

$$\omega_{vco} = \omega_0 + K_V v_E(t)$$

where $K_V$ is the gain of VCO 306 in radians-per-second per volt. If a periodic input is applied to PLL 212 with frequency $\omega_I$ sufficiently close to the free-running frequency $\omega_0$, an error voltage $v_E$ will develop, which will adjust $\omega_{vco}$ until $v_O$ becomes synchronized, or locked, with $v_I$. Should $\omega_I$ change, the phase shift between $v_O$ and $v_I$ will start to increase, changing $v_D$ and $v_E$. VCO 306 may be configured such that this change in $v_E$ adjusts $\omega_{vco}$ until it is brought back the same value as $\omega_I$, allowing the PLL 212, once locked, to track input frequency changes.

In some embodiments, VCO 306 may comprise an inductor-capacitor ("LC") VCO. Factors that may contribute to the variation of the frequency of VCO 306 across a range of temperatures include the variation across temperature of parasitic capacitance in the VCO active stage, variation across temperature of a variable capacitance bank, and variation across temperature of a supply voltage that may be provided by voltage regulator 308 to power VCO 306 that may cause a variation in a supply-dependent parasitic capacitance in the VCO active stage and a supply-dependent variable capacitance bank in VCO 306. The described factors may have a temperature dependency that may vary the effective tank capacitance of an LC VCO, and in turn, the factors may cause a frequency shift of VCO 306 across a range of temperatures.

While the closed loop operation of PLL 212 may compensate for some variation of VCO 306 over temperature, too much variation of VCO 306 can lead the PLL 212 to go out of lock. However, a temperature compensation scheme may be implemented to offset the variation of VCO 306 over temperature. For example, voltage regulator 308 may be configured to provide a supply voltage with a temperature coefficient that may offset the other factors that may impact the frequency variation of VCO 306 over a range of temperatures. In some embodiments, the temperature compensation scheme may not perfectly offset other factors impacting the frequency variation of VCO 306 over temperature, but the temperature compensation scheme may significantly reduce the overall variation of VCO 306 over temperature to the extent that the closed loop operation of PLL 212 may account for the remaining variation without PLL 212 going out of lock.

Figure 4:
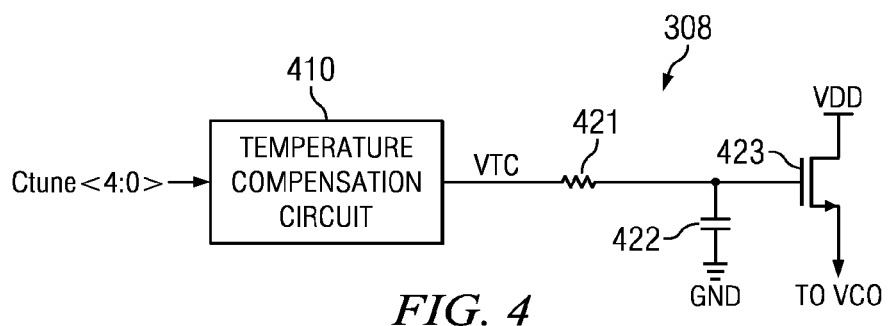
FIG. 4 depicts a block diagram of a voltage regulator, in accordance with certain embodiments of the present disclosure.

FIG. 4 depicts a block diagram of voltage regulator 308, in accordance with certain embodiments of the present disclosure. Voltage regulator 308 may include a temperature compensation circuit 410, a resistor 421, a capacitor 422, and an N-type metal-oxide semiconductor field-effect transistor (NMOS) 423. Temperature compensation circuit 410 may drive a voltage signal, VTC. Resistor 421 may have a first terminal coupled to the VTC output of temperature compensation circuit 410 and a second terminal coupled to a gate of NMOS 423. Capacitor 422 may have a first terminal coupled to a gate of NMOS 423 and a second terminal coupled to a low potential power supply, which, for the purposes of the present disclosure, may be referred to as "GND." Accordingly, resistor 421 and capacitor 422 may provide an RC-filter on the VTC signal. NMOS 423 may have a drain coupled to a high potential power supply, which for the purposes of the present disclosure, may be referred to as "VDD." As described above, a gate of NMOS 423 may be driven by the VTC signal through an RC filter. NMOS 423 may have a source that may be coupled to the output of voltage regulator 308 used to supply power to VCO 306. In the configuration described above, NMOS 423 may be described as operating in source-follower mode. Accordingly, the regulator output at the source of NMOS 423 may track the VTC signal that may drive the gate of NMOS 423 through an RC filter.

In some embodiments, VCO 306 may experience different amounts of temperature variation at different operating frequencies. Further, VCO 306 may experience different amounts of temperature variation across different ranges of temperatures. For example, VCO 306 may experience a larger amount of temperature variation at the higher end of its oscillator frequency range than at the lower end of its oscillator frequency range. Also, VCO 306 may, for example, experience one level of variation from a cold temperature to a median temperature and experience a second level of variation from a median temperature to a hot temperature. To compensate for the described variations, some embodiments of temperature compensation circuit 410 may provide different temperature coefficients at different temperature ranges. Further, in some embodiments of temperature compensation circuit 410, different temperature coefficients at different temperature ranges may be independently programmable. The generation of multiple independently programmable temperature coefficients may be discussed below in greater detail with reference to FIG. 5 and FIG. 6.

As described above, VCO 306 may have a range of frequencies in which it may operate. VCO 306 may be configured such that it may be tuned to a frequency corresponding to the desired PLL 212 frequency. For example, in some embodiments, VCO 306 may receive a five-bit course tune signal (Ctune <4:0>) that may tune VCO 306 to one of thirty-two potential coarse frequency ranges at, for example, 20 MHz steps. In some embodiments, VCO 306 may be finely tuned within the selected coarse-tune range after being coarsely tuned by the Ctune<4:0> signal. As described above, the temperature variation of VCO 306 may be different at different operating frequencies. Accordingly, the five-bit coarse tune signal may also be received by the temperature compensation circuit 410, which may use the Ctune<4:0> signal to select a cold-to-median temperature coefficient and a median-to-hot temperature coefficient, both of which may correspond to the cold-to-median and median-to-hot temperature variations of VCO 306 at the frequency designated by the Ctune<4:0> signal.

Figure 5:
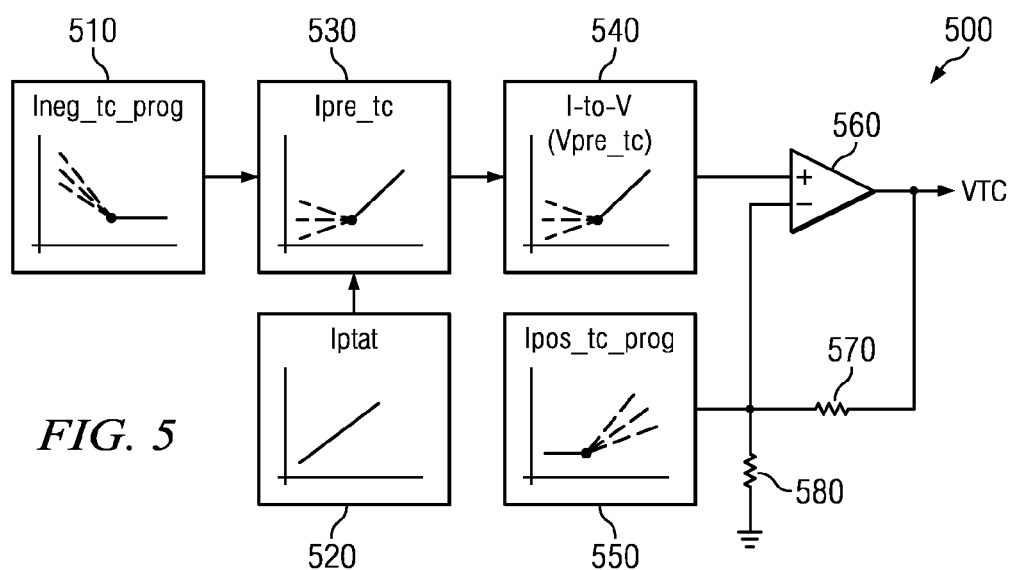
FIG. 5 depicts a functional block diagram illustrating a temperature compensation scheme, in accordance with certain embodiments of the present disclosure.

FIG. 5 depicts a functional block diagram 500 of a temperature compensation scheme, in accordance with certain embodiments of the present disclosure.

In the present disclosure, various temperatures may be referred to as "cold," "room," or "hot" temperatures. As used herein, "room" temperature may be used to describe the temperature of a device based on ambient air temperatures. Such temperatures may commonly be in the range of twenty-five to thirty degrees Celsius.

In the present disclosure, various temperatures may be referred to as a "median" temperature. A "median" temperature may refer to a selected temperature that may be less than, in the range of, or greater than "room" temperature. When referred to in conjunction with a median temperature, a "cold" temperature may mean any temperature less than a selected median temperature, and a "hot" temperature may mean any temperature greater than a selected median temperature. Accordingly, when discussed in terms of a range, "cold to median" may refer to a range of temperatures starting at less than the median temperature and going to the median temperature, and "median to hot" may refer to a range of temperatures starting at a median temperature and going to a temperature that may be greater than the median temperature.

Block 510 illustrates a current, Ineg_tc_prog, that may have a programmable negative temperature coefficient from cold to median, and zero temperature coefficient from median to hot. The generation of Ineg_tc_prog may be described in further detail below in reference to FIG. 6 and FIG. 7E.

Block 520 illustrates a current proportional-to-absolute-temperate, Iptat, that may have a positive temperature coefficient from cold to hot. The generation of Iptat may be described in further detail below in reference to FIG. 6 and FIG. 7A.

Block 530 illustrates the summation of Ineg_tc_prog and Iptat to generate a current, Ipre_tc, that may have a programmable temperature coefficient from cold to median and a positive temperature coefficient from median to hot. Block 540 illustrates the conversion of Ipre_tc into a voltage signal, Vpre_tc. The generation of Ipre_tc and its conversion into Vpre_tc may be described in further detail below in reference to FIG. 6.

Block 550 illustrates a current, Ipos_tc_prog, that may have zero temperature coefficient from cold to median, and a programmable positive temperature coefficient from median to hot. The generation of Ipos_tc_prog may be described in further detail below in reference to FIG. 6 and FIG. 7C.

As shown in FIG. 5, Ipos_tc_prog may be injected into a feedback network of amplifier 560, at for example, the negative input of amplifier 560. The feedback network of amplifier 560 may include a resistor 570 coupled from the output of amplifier 560 to the negative input of amplifier 560 and a resistor 580 coupled from the negative input of amplifier 560 to GND.

Amplifier 560 may combine the Vpre_tc signal and the Ipos_tc_prog signal according to the feedback network. Amplifier may output a voltage signal, VTC, with a first programmable temperature coefficient from cold to median and a second programmable temperature coefficient from median to hot. The generation of the VTC signal and the characteristics of the VTC signal may be described in more detail below in reference to FIG. 6 and FIG. 7F.

Figure 6:
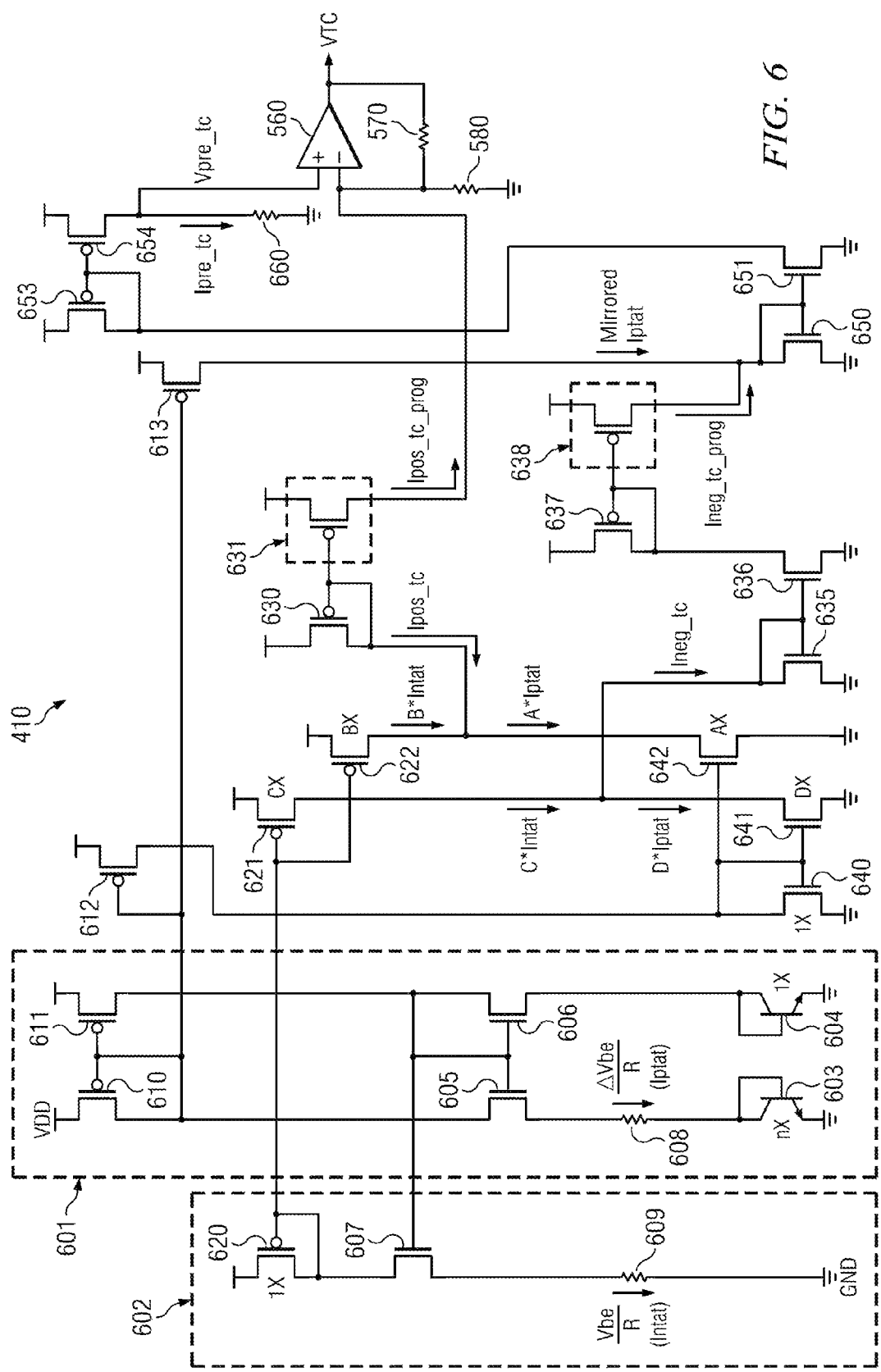
FIG. 6 depicts a schematic diagram of a temperature compensation circuit, in accordance with certain embodiments of the present disclosure.

FIG. 6 depicts a schematic diagram of temperature compensation circuit 410, in accordance with certain embodiments of the present disclosure. FIGS. 7A-7E include graphs illustrating various currents that may be generated inside of temperature compensation circuit 410, in accordance with certain embodiments of the present disclosure, and may be referenced to in conjunction with FIG. 6. FIG. 7F depicts a graph illustrating an output voltage of the temperature compensation circuit 410, in accordance with certain embodiments of the present disclosure, and may be referenced to in conjunction with FIG. 6.

In the present disclosure, the term "equivalent" may be used to describe two or more currents that may be designed to be approximately equal to each other or to describe two or more voltage potentials that may be designed to be approximately equal to each other. Though they may be designed to be approximately equal to each other, "equivalent" voltages, "equivalent" currents, or other "equivalent" items may include some variation due to factors including, but not limited to, device matching imperfections, semiconductor processing imperfections, and/or imbalanced operating conditions.

The present disclosure may refer to the "size" of various types of transistors, including an N-type bipolar junction transistor (NPN), an N-type metal-oxide semiconductor field-effect transistor (NMOS), and a P-type metal-oxide semiconductor field-effect transistor (PMOS). Unless otherwise specified, the description of a transistor's size, as used herein, describes the size parameter that affects the transconductance of the transistor. For example, for NPN devices, "size" may refer to the area of the NPN's base-to-emitter junction. Also, for PMOS and NMOS devices, "size" may refer to the width-to-length ratio of the gate and/or conducting channel of the device. Accordingly, devices that are described as having a size at a ratio, or being sized at a ratio, as compared to another otherwise matching device, may have a transconductance that is larger or smaller at that ratio as compared to the transconductance of the other device.

Temperature compensation circuit 410 may include an Iptat generator 601. Iptat generator 601 may include an NPN 603, an NPN 604, a resistor 608, an NMOS 605, an NMOS 606, a PMOS 610, and a PMOS 611.

NPN 603 may have a collector and a base that may be coupled together and an emitter that may be coupled to GND. NPN 604 may have a collector and a base that may be coupled together and an emitter that may be coupled to GND. Resistor 608 may have a first terminal coupled to a source of NMOS 605 and a second terminal coupled to a base and a collector of NPN 603. NMOS 606 may have a gate and a drain that are coupled together and a source that may be coupled to a base and a collector of NPN 604. NMOS 605 may have a gate that may be coupled to a gate and a drain of NMOS 606. PMOS 610 may have a source that may be coupled to VDD. PMOS 610 may have a gate and a drain that may be coupled together and further coupled to a drain of NMOS 605. PMOS 611 may have a source coupled to VDD, a drain coupled to a gate and a drain of NMOS 606, and a gate coupled to a gate and a drain of PMOS 610.

NPN 603 may be sized at a ratio of N:1 as compared to NPN 604, where "N" may be a number larger than one. As described above, the respective gates of PMOS 610 and PMOS 611 may be coupled to a drain of PMOS 610. Accordingly, PMOS 611 may mirror the current of PMOS 610, forcing the current through NMOS 606 and NPN 604 to be equivalent to the current through NMOS 605 and NPN 603.

Because the size of NPN 603 may be larger than the size of NPN 604, the base-to-emitter voltage (Vbe) for NPN 603 may be less than the Vbe of NPN 604. The difference between the Vbe of NPN 604 and the Vbe of NPN 603 may be referred to as a "delta Vbe" or a "ΔVbe."

NMOS 606 may match NMOS 605, and because the current through NMOS 605 may be equivalent to the current through 606, the gate-to-source voltage of NMOS 605 may be equivalent to the gate-to-source voltage of NMOS 606. Accordingly, the voltage at the source of NMOS 605 may be equivalent to the voltage at the source of NMOS 605. Thus, the voltage across resistor 608 may be equivalent to the delta Vbe of NPN 604 and NPN 603, and the current through resistor 608 may be described as ΔVbe divided by resistor 608, or generically as a "ΔVbe/R" current. ΔVbe may have a positive temperature coefficient, i.e., the magnitude of ΔVbe may become larger at higher absolute temperatures. For example, in some embodiments, ΔVbe may increase approximately 0.087 mV per degree Celsius. Accordingly, the ΔVbe/R current through resistor 608 may have a positive temperature coefficient and may be described as a current proportional-to-absolute-temperature ("Iptat").

As described above, PMOS 610 may have a gate and a drain that may be coupled to each other, and NMOS 606 may have a gate and a drain that may be coupled to each other. Accordingly, PMOS 610 and NMOS 606 may be described as being configured to be self-biased devices during normal operation. In some embodiments, the high potential power supply, VDD, may be at zero volts before the power is turned on. Once power is applied to VDD, during, for example, power-up of a device including an embodiment, the voltage potential of VDD may rise from zero volts to a high potential, e.g., 1.8 volts. During such a power-up event, start-up devices (not expressly shown), as known in the art, may be used to inject a start-up current or start-up currents into the paths of PMOS 610 and/or NMOS 606 in order for those devices to become self-biased. After power-up, PMOS 610 and NMOS 606 may be self-biased and fully operational, and accordingly, the start-up current or currents may be turned off.

Temperature compensation circuit 410 may include an Intat generator 602. Intat generator 602 may include a resistor 609, an NMOS 607, and a PMOS 620. Resistor 609 may have a first terminal coupled to GND and a second terminal coupled to the source of NMOS 607. NMOS 607 may have a gate that may be coupled to the gate and drain of NMOS 606. PMOS 620 may have a source coupled to VDD and a gate and a drain that may be coupled together and further coupled to the drain of NMOS 607.

NMOS 607 may match NMOS 606, and the current through NMOS 607 may be configured to be equivalent to the current through NMOS 606. Accordingly, the gate-to-source voltage of NMOS 607 may be approximately the same as the gate-to-source voltage of NMOS 606. Thus, the voltage potential at the source of NMOS 607 may be equivalent to the voltage potential at the source of NMOS 606, causing the voltage potential across resistor 609 to be equivalent to the Vbe of NPN 604. Accordingly, the current through resistor 609 may be described as a Vbe divided by resistor 609, or generically as a "Vbe/R" current. The Vbe of NPN 604 may have a negative temperature coefficient, i.e., the magnitude of Vbe may become lower at higher temperatures. For example, in some embodiments, Vbe may decrease approximately −1.5 mV per degree Celsius. Accordingly, the Vbe/R current through resistor 609 may have a negative temperature coefficient and may be described as a current negative-to-absolute-temperature ("Intat").

Figure 7A:
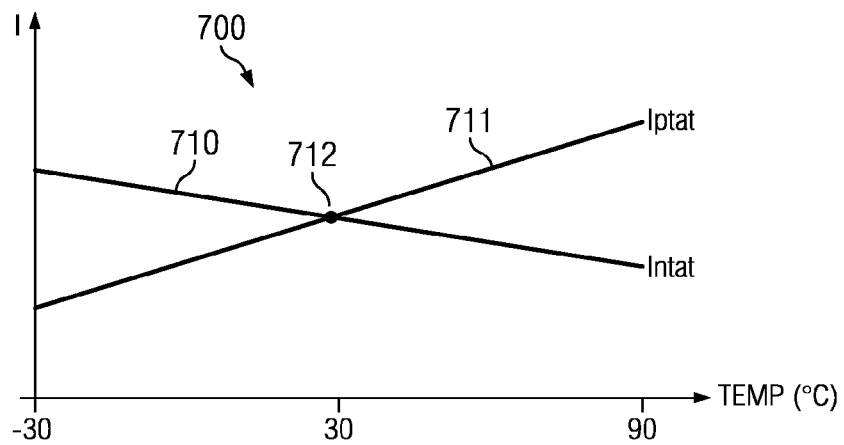
FIG. 7A depicts a graph illustrating an Iptat current and an Intat current across a range of temperatures, in accordance with certain embodiments of the present disclosure.

Graph 700 in FIG. 7A depicts an Iptat current 711 and an Intat current 710 across a range of temperatures, in accordance with some embodiments of the present disclosure. As illustrated in FIG. 7A, Iptat current 711 may be lower than Intat current 710 from cold to room. Iptat 711 may increase with increased temperature and Intat 710 may decrease with increased temperature. Accordingly, Iptat 711 and Intat 710 may be equivalent at an intersection temperature 712 that may be equal to room temperature. In some alternative embodiments, the intersection temperature 712 may move to a temperature that may be greater or less than room temperature if Iptat is scaled up or down. For example, in some embodiments, Iptat current 711 may be scaled up, thus causing the intersection temperature 712 to be lower than room temperature. In some alternative embodiments, Iptat current 711 may be scaled down, thus causing the intersection temperature 712 to be higher than room temperature. Similarly, in some alternative embodiments, the intersection temperature 712 may move if Intat is scaled up or down. For example, in some embodiments, Intat current 710 may be scaled up, thus causing the intersection temperature 712 to be higher than room temperature. In some alternative embodiments, Intat current 710 may be scaled down, thus causing the intersection temperature 712 to be lower than room temperature. Accordingly, the intersection temperature may be described as a selected "median" temperature.

Referring back to FIG. 6, a current with a positive temperature coefficient from median to hot ("Ipos_tc") may be generated at PMOS 630 by comparing mirrored versions of the Iptat current and the Intat current. Temperature compensation circuit 410 may include a PMOS 612, an NMOS 640, an NMOS 642, a PMOS 622, a PMOS 630, and a programmable-PMOS 631.

PMOS 612 may have a source that may be coupled to VDD and a gate that may be coupled to the gate and drain of PMOS 610. Accordingly, PMOS 612 may mirror the Iptat current 711 flowing through PMOS 610. NMOS 640 may have a source coupled to GND and have a gate and a drain that are coupled together and further coupled to the drain of PMOS 612. Accordingly, NMOS 640 may sink the mirrored Iptat current from PMOS 612. NMOS 642 may have a source coupled to GND and a gate coupled to the gate and drain of NMOS 640. NMOS 642 may be sized at a ratio of A:1 as compared to NMOS 640. Accordingly, NMOS 642 may mirror the Iptat current of NMOS 640 at a ratio of A:1 and sink a current 740 that may be equivalent to A*Iptat.

PMOS 622 may have source coupled to VDD and a gate coupled to the gate and drain of PMOS 620. PMOS 622 may be sized at a ratio of B:1 as compared to PMOS 620. Accordingly, when operating in saturation mode, PMOS 622 may mirror the Intat current of PMOS 620 at a ratio of B:1 and source a current 741 that may be equivalent to B*Intat.

Figure 7B:
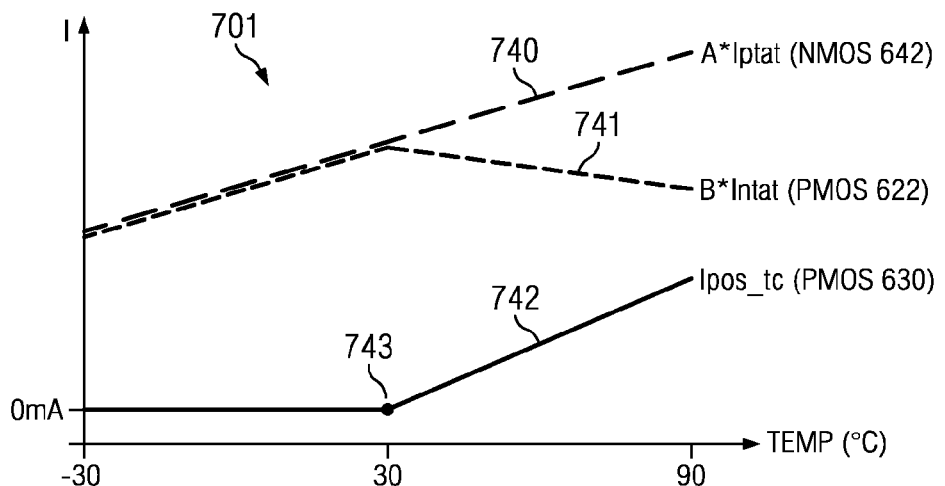
FIG. 7B depicts a graph illustrating the subtraction of an Intat current from an Iptat current, in accordance with certain embodiments of the present disclosure.
Figure 7C:
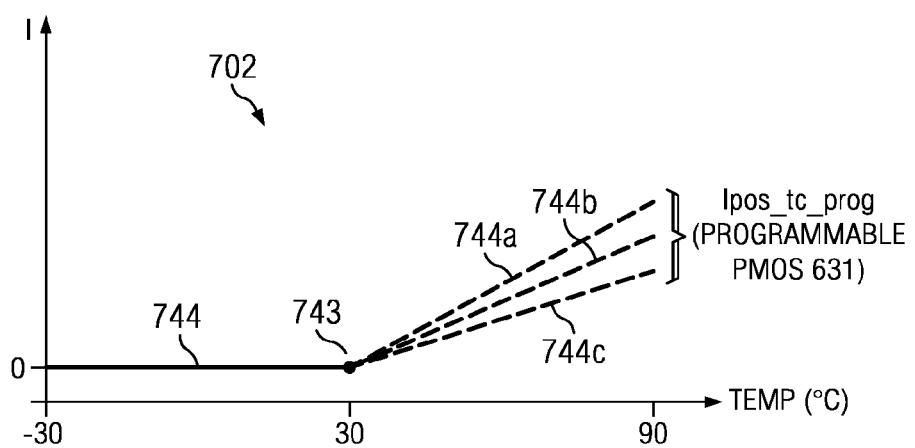
FIG. 7C depicts a graph illustrating a current with a programmable positive temperature from room to hot, in accordance with certain embodiments of the present disclosure.

Graph 701 in FIG. 7B depicts the subtraction of an Intat current from an Iptat current, in accordance with certain embodiments of the present disclosure. Referring back to FIG. 6, PMOS 630 may have a source that may be coupled to VDD, and a gate and drain that may be coupled to each other and may be further coupled to the respective drains of PMOS 622 and NMOS 642. Accordingly, PMOS 630 may source a current 742 (Ipos_tc) that equals current 740 (A*Iptat) minus current 741 (B*Intat). At cold temperatures, Iptat may be lower than Intat. Accordingly, from cold to median, PMOS 622 may operate in linear mode and current 741 sourced by PMOS 622 may be limited by current 740 sunk by NMOS 642, and current 742 sourced by PMOS 630 may equal zero. At hot temperatures, Iptat may be higher than Intat. Accordingly, the difference between current 740 sunk by NMOS 642 and current 741 sourced by PMOS 622 may increase from median to hot, and current 742 sourced by PMOS 630 may increase from median to hot.

As shown in FIG. 7B, current 742 sourced by PMOS 630 equals zero from cold to the median temperature of inflection point 743 where A*Iptat equals B*Intat. Current 742 then increases from the median temperature of inflection point 743 to hot temperatures where the difference between A*Iptat and B*Intat becomes larger at higher temperatures. In some alternative embodiments, the ratio of A:B may be increased, which may cause the inflection point 743, at which the current sourced by PMOS 630 begins to rise, to be located at a lower temperature. In some alternative embodiments, the ratio of A:B may be decreased, which may cause the inflection point 743, at which the current sourced by PMOS 630 begins to rise, to be located at a higher temperature.

Referring back to FIG. 6, programmable-PMOS 631 may have a source terminal coupled to VDD and a gate terminal coupled to the gate and drain of PMOS 630. In some embodiments, programmable-PMOS 631 may include a plurality of individual PMOS devices that may be turned off when their gates are driven by VDD, but may be selected to add to the effective size of programmable-PMOS 631 when their gates are driven by the gate terminal of programmable-PMOS 631. Accordingly, programmable-PMOS 631 may have a programmable effective size and may mirror the current of PMOS 630 at a programmable ratio. Thus, as shown in graph 702 of FIG. 7C, programmable-PMOS 631 may source a current 744 (Ipos_tc_prog) that may be equal to zero from a cold temperature to the median temperature of inflection point 743, and a positive programmable temperature coefficient from the median temperature of inflection point 743 to a hot temperature. When a larger number of PMOS devices inside of programmable-PMOS 631 are selected, Ipos_tc_prog may be larger as shown by current 744a. On the other hand, when a smaller number of PMOS devices inside of programmable-PMOS 631 are selected, Ipos_tc_prog may be smaller as shown by current 744c.

As described above, temperature compensation circuit 410 may receive a five-bit coarse tune signal (Ctune<4:0>) that may also be used to tune VCO 306 to one of thirty-two potential frequency ranges. In some embodiments, Ctune<4:0> may be translated and input into the control bits of programmable-PMOS 631. Programmable-PMOS 631 may be configured such that each setting of the Ctune<4:0> signal, and the corresponding setting of the control bit inputs, may select the proper number of individual PMOS devices inside of programmable-PMOS 631 to select the magnitude of current 744 required to generate a temperature coefficient from median to hot that may offset the temperature coefficient of VCO 306 at the frequency corresponding to the Ctune<4:0> setting.

In some alternative embodiments, the coarse tune signal may have a number of bits other than five. Further, though temperature compensation circuit 410 is described herein in conjunction with VCO 306 in PLL 212, some embodiments of temperature compensation circuit 410 may be used in conjunction with other types of circuits that may have parameters that vary over temperature. Some embodiments may include any suitable number of control bits to provide a required range of potential values for Ipos_tc_prog from median to hot. In some embodiments the control bit or bits of programmable-PMOS 631 may be driven dynamically. In some embodiments, the control bit or bits of programmable-PMOS 631 may be driven by registers stored in memory, e.g., Electrically Erasable Programmable Read-Only Memory (EEPROM) or other types of memory. In some embodiments, the control bit or bits of programmable-PMOS 631 may be hard-coupled to GND or VDD, for example, by metal-layer connections in a semiconductor process.

Referring back to FIG. 6, a current with a negative temperature coefficient from cold to median ("Ineg_tc") may be generated at NMOS 635 by comparing mirrored versions of the Iptat current and the Intat current. Temperature compensation circuit 410 may include a PMOS 621, an NMOS 641, an NMOS 635, an NMOS 636, a PMOS 637, and a programmable-PMOS 638.

PMOS 621 may have a source that may be coupled to VDD and gate that may be coupled to the gate and drain of PMOS 620. PMOS 621 may be sized at a ratio of C:1 as compared to PMOS 620. Accordingly, PMOS 621 may mirror the Intat current of PMOS 620 at a ratio of C:1 and source a current that may be equivalent to C*Intat.

NMOS 641 may have a source that may be coupled to GND and a gate that may be coupled to the gate and drain of NMOS 640. NMOS 641 may be sized at a ratio of D:1 as compared to NMOS 640. Accordingly, when operating in saturation mode, NMOS 641 may mirror the current of NMOS 640 at a ratio of D:1 and sink a current that may be equivalent to D*Iptat.

Figure 7D:
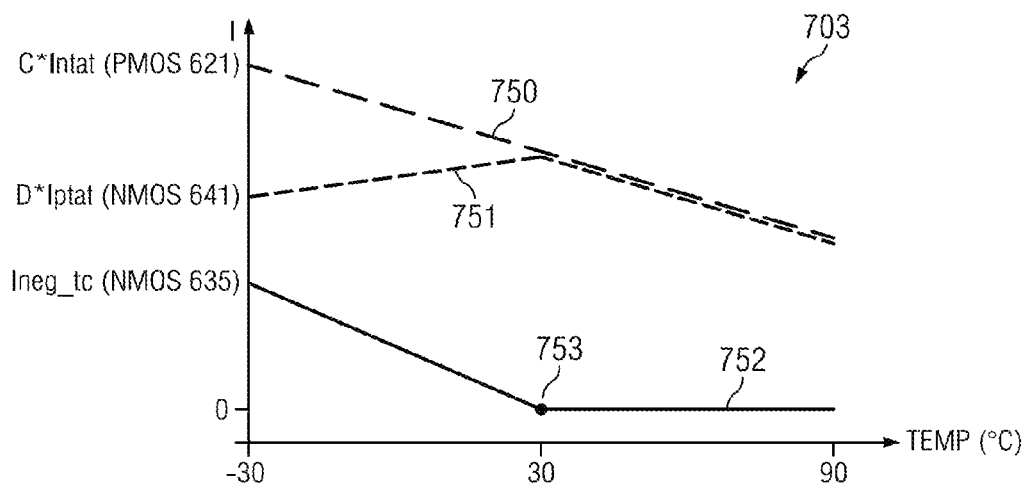
FIG. 7D depicts a graph illustrating the subtraction of an Iptat current from an Intat current, in accordance with certain embodiments of the present disclosure.
Figure 7E:
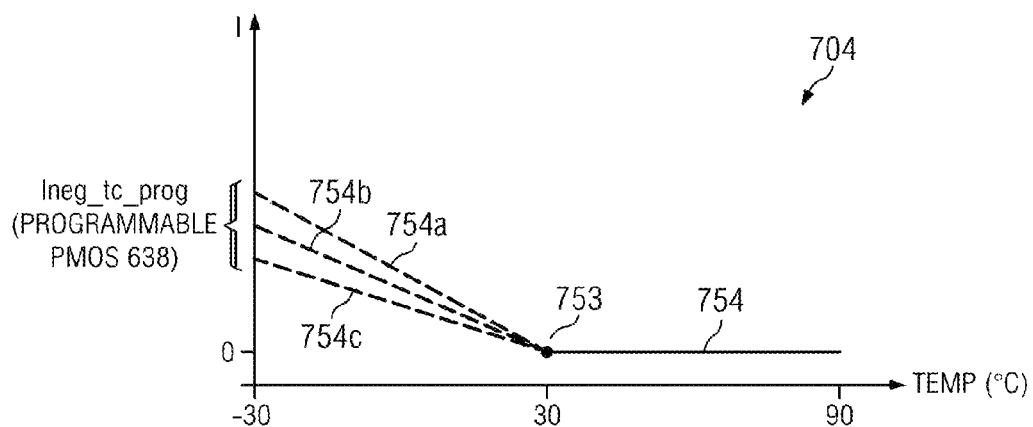
FIG. 7E depicts a graph illustrating a current with a programmable negative temperature from cold to room, in accordance with certain embodiments of the present disclosure.
Figure 7F:
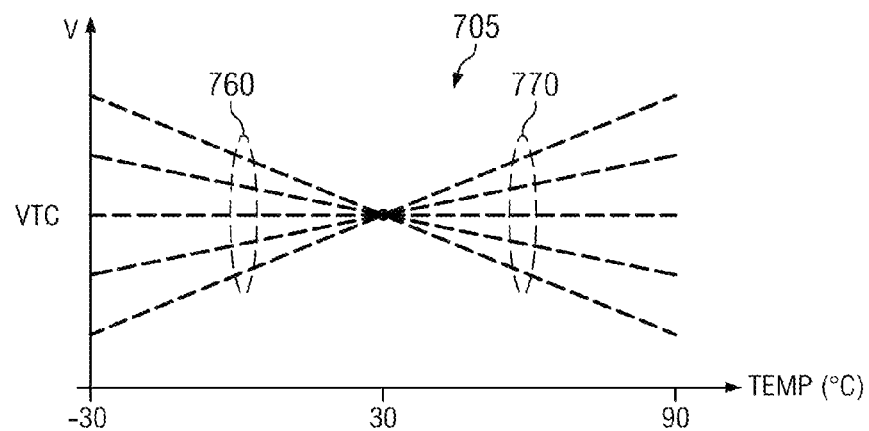
FIG. 7F depicts a graph illustrating an output voltage of a temperature compensation circuit, in accordance with certain embodiments of the present disclosure.

Graph 703 in FIG. 7D depicts the subtraction of an Iptat current from an Intat current, in accordance with certain embodiments of the present disclosure. Referring back to FIG. 6, NMOS 635 may have a source that may be coupled to GND, and a gate and drain that are coupled to each other and are further coupled to the respective drains of PMOS 621 and NMOS 641. Accordingly, NMOS 635 may sink a current 752 (Ineg_tc) that equals current 750 (C*Intat) minus current 751 (D*Iptat). At cold temperatures, Iptat may be lower than Intat. Accordingly, the difference between current 750 sourced by PMOS 621 and current 751 sunk by NMOS 751 may decrease from cold to median, and current 752 sunk by NMOS 635 may decrease from cold to median. At hot temperatures, Iptat may be greater than Intat. Accordingly, from median to hot, NMOS 641 may operate in linear mode and current 751 sunk by NMOS 641 may be limited by current 750 sourced by PMOS 621, and current 752 sunk by NMOS 635 may equal zero.

As shown in FIG. 7D, current 752 sunk by NMOS 635 may decrease from cold to median, equaling zero at the median temperature of inflection point 753 where D*Iptat equals C*Intat. In some alternative embodiments, the ratio of C:D may be increased, which may cause the inflection point 753, at which the current sunk by NMOS 635 equals zero, to be located at a higher temperature. In some alternative embodiments, the ratio of C:D may be decreased, which may cause the inflection point 753, at which the current sunk by NMOS 635 hits zero, to be located at a lower temperature.

Referring back to FIG. 6, NMOS 636 may have a source that may be coupled to GND and a gate that may be coupled to the gate and drain of NMOS 635. Accordingly, NMOS 636 may mirror the current of NMOS 635. PMOS 637 may have a source that may be coupled to VDD and a gate and a drain that are coupled to each other and are further coupled to the drain of NMOS 636. Accordingly, PMOS 637 may source the mirrored current of Ineg_tc.

Programmable-PMOS 638 may have a source terminal coupled to VDD and a gate terminal coupled to the gate and drain of PMOS 637. In some embodiments, programmable-PMOS 638 may include a plurality of individual PMOS devices that may be turned off when their gates are driven by VDD and may add to the effective size of programmable-PMOS 638 when their gates are driven by the gate terminal of programmable-PMOS 638. Accordingly, programmable-PMOS 638 may have a programmable effective size and may mirror the current of PMOS 637 at a programmable ratio. Thus, as shown in graph 704 of FIG. 7E, programmable-PMOS 638 may source a current 754 (Ineg_tc_prog) that may have a programmable negative temperature coefficient from a cold temperature to the median temperature of inflection point 753, and may equal zero from the median temperature of inflection point 753 to a hot temperature. When a larger number of PMOS devices inside of programmable-PMOS 638 are selected, Ineg_tc_prog may be larger as shown by current 754*a*. On the other hand, when a smaller number of PMOS devices inside of programmable-PMOS 638 are selected, Ineg_tc_prog may be smaller as shown by current 754*c*.

As described above, temperature compensation circuit 410 may receive a five-bit course tune signal (Ctune<4:0>) that may also be used to tune VCO 306 to one of thirty-two potential frequency ranges. In some embodiments, Ctune<4:0> may be translated and input into the control bits of programmable-PMOS 638. Programmable-PMOS 638 may be configured such that each setting of the Ctune<4:0> signal, and the corresponding setting of the control bit inputs, may select the proper number of individual PMOS devices inside of programmable-PMOS 638 to select the magnitude of current 754 required to generate a temperature coefficient from cold to median that may offset the temperature coefficient of VCO 306 at the frequency corresponding to the Ctune<4:0> setting.

In some alternative embodiments, the coarse tune signal may have a number of bits other than five. Further, though temperature compensation circuit 410 is described herein in conjunction with VCO 306 in PLL 212, some embodiments of temperature compensation circuit 410 may be used in conjunction with other types of circuits that may have parameters that vary over temperature. Some embodiments may include any suitable number of control bits to provide a required range of potential values for Ineg_tc_prog current from cold to median. In some embodiments the control bit or bits of programmable-PMOS 638 may be driven dynamically. In some embodiments, the control bit or bits of programmable-PMOS 638 may be driven by registers stored in memory, e.g., electrically erasable programmable read-only memory (EEPROM) or other types of memory. In some embodiments, the control bit or bits of programmable-PMOS 638 may be hard-coupled to GND or VDD, for example, by metal-layer connections in a semiconductor process.

Referring back to FIG. 6, a current with a programmable temperature coefficient from cold to median and a positive temperature coefficient from median to hot (Ipre_tc) may be generated by adding Ineg_prog_tc to an Iptat current. Temperature compensation circuit 410 may include a PMOS 613, an NMOS 650, an NMOS 651, a PMOS 653, and a PMOS 654. PMOS 613 may have a source coupled to VDD and a gate coupled to the gate and drain of PMOS 610. Accordingly, PMOS 613 may mirror the Iptat current of PMOS 610. NMOS 650 may have a source coupled to GND and a gate and a drain coupled to each other. The gate and drain of NMOS 650 may be further coupled to a drain of PMOS 613 and a drain terminal of programmable PMOS 638. Accordingly, NMOS 650 may sink both the mirrored Iptat current from PMOS 613 and Ineg_tc_prog from programmable-PMOS 638. NMOS 651 may have a source coupled to GND and a gate coupled to the gate and drain of NMOS 650. Accordingly, NMOS 651 may mirror the sum of the Iptat current and Ineg_tc_prog. PMOS 653 may have a source coupled to VDD and gate and a drain coupled to each other and further coupled to the drain of NMOS 651. Accordingly, PMOS 653 may source the sum of an Iptat current and Ineg_tc_prog. PMOS 654 may have a source coupled to VDD and a gate coupled to the gate and drain of PMOS 653. Accordingly, PMOS 654 may mirror the sum of an Iptat current and Ineg_tc_prog and source a current Ipre_tc. As a sum of an Iptat current and Ineg_tc_prog, Ipre_tc may have a programmable temperature coefficient from cold to median and a positive temperature coefficient from median to hot.

Temperature compensation circuit 410 may include a resistor 660. Resistor 660 may have a first terminal coupled to GND and a second terminal coupled to the drain of PMOS 654. Accordingly, resistor 660 may convert Ipre_tc to a voltage potential Vpre_tc, which, similar to Ipre_tc, may have a programmable temperature coefficient from cold to median and a positive temperature coefficient from median to hot.

Temperature compensation circuit 410 may include amplifier 560 as well as a feedback-network resistor 570 and a feedback-network resistor 580. Amplifier 560 may include a positive input terminal that may be driven by Vpre_tc. Feedback-network resistor 570 may have a first terminal coupled to an output of amplifier 560 and a second terminal coupled to a negative input terminal of amplifier 560. Feedback-network resistor 580 may have a first terminal coupled to GND and a second terminal coupled to a negative input terminal of amplifier 560. The negative input terminal of amplifier 560 may also be coupled to the drain terminal of programmable-PMOS 631. Thus, Ipos_tc_prog may be injected into the feedback network of amplifier 560.

At the positive input terminal of amplifier 560, Vpre_tc may have, as described above, a programmable temperature coefficient from cold to median and a positive temperature coefficient from median to hot. At the negative input terminal of amplifier 560, Ipos_tc_prog may be injected into the feedback network, as described above, with zero temperature coefficient from cold to median and with a programmable positive temperature coefficient from median to hot. Accordingly, the output terminal of amplifier 560 may drive a voltage signal VTC that, as shown in graph 705 of FIG. 7F, may have a programmable temperature coefficient 760 from cold to median that may be programmed to be either positive or negative. Further, the positive temperature coefficient from median to hot of Vpre_tc at the positive input terminal of amplifier 560 may offset the positive slope to the positive programmable temperature coefficient of Ipos_tc_prog at the negative input terminal of amplifier 560. Accordingly, as shown in graph 705 of FIG. 7F, VTC may have a programmable temperature coefficient 770 from median to hot that may be programmed to be either a positive or a negative temperature coefficient.

Referring back to FIG. 5, diagram 500 depicts, as described above, various temperature coefficient signals that may be generated and combined within temperature compensation circuit 410. For example, diagram 500 shows Ineg_tc_prog being combined with an Iptat current to generate an Ipre_tc signal which may be converted into an Vpre_tc signal having a programmable temperature coefficient from cold to median and a positive temperature coefficient from median to hot. The Vpre_tc signal may be input into the positive input terminal of amplifier 560 while the Ipos_tc_signal, which may have a zero temperature coefficient from cold to median and a positive programmable temperature coefficient from median to hot, may be input into the feedback network at the negative input terminal of amplifier 560. Accordingly, as shown in FIG. 7F, a VTC signal may be generated that may have a temperature coefficient from cold to median that may be programmed to be either positive or negative, and may have a temperature coefficient from median to hot that may be programmed to be either positive or negative.

Some alternative embodiments may use other combinations of signals to generate the VTC signal. For example, in some embodiments: (i) an Intat signal may be combined with an Ipos_tc_prog signal to create an Ipre_tc signal that may have a negative temperature coefficient from cold to median and a programmable temperature coefficient from median to hot; (ii) the Ipre_tc signal may be converted to a voltage signal, Vpre_tc, and input into the positive input terminal of amplifier 560; and (iii) an Ineg_tc_prog signal with a negative programmable temperature coefficient from cold to median may be input into the feedback network at the negative input terminal of amplifier 560. Accordingly, in such embodiments, a VTC signal may be generated that may have a temperature coefficient from cold to median that may be programmed to be either positive or negative, and may have a temperature coefficient from median to hot that may be programmed to be either positive or negative.

Figure 8:
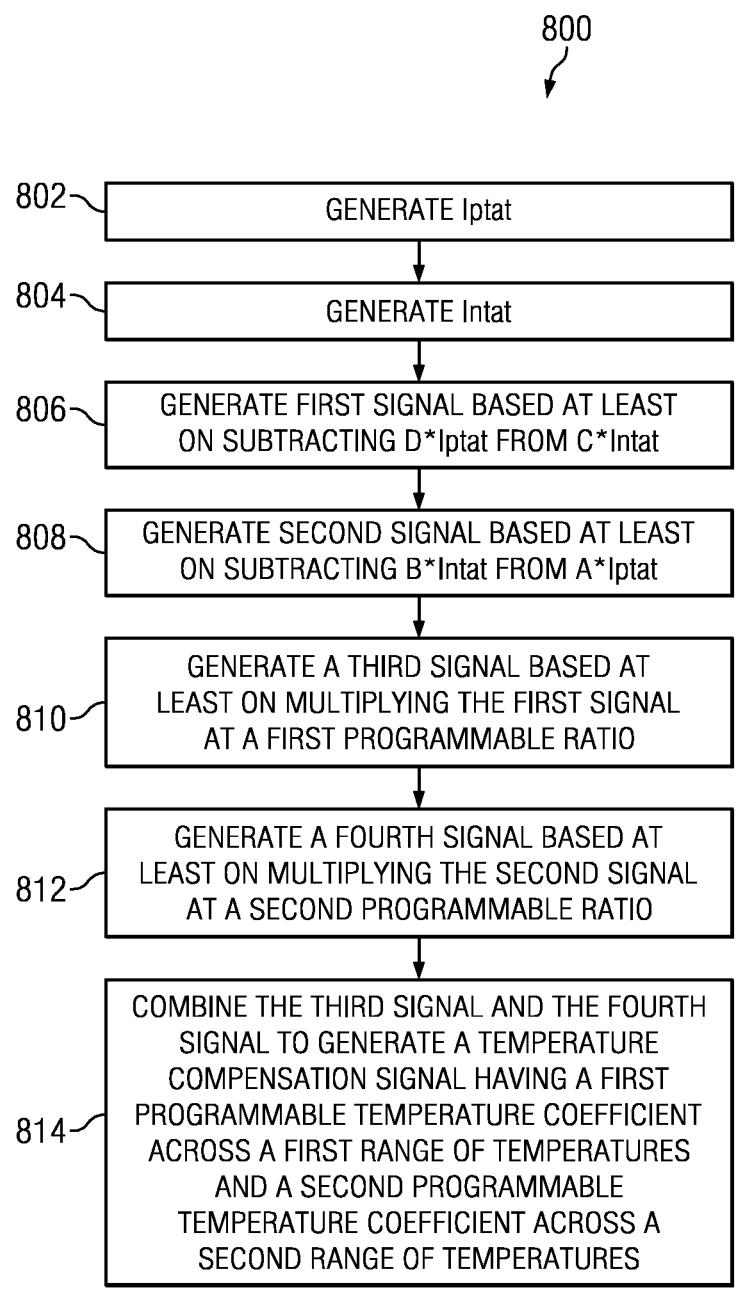
FIG. 8 depicts a flow chart of a method for generating a temperature compensation signal, in accordance with certain embodiments of the present disclosure.

FIG. 8 depicts a flow chart of a method for generating a temperature compensation signal, in accordance with certain embodiments of the present disclosure.

At step 802, Iptat generator 601 may generate a current that is proportional to absolute temperature, i.e., has a positive temperature coefficient. In some embodiments, Iptat may be based on the ΔVbe between NPN 604 and NPN 603 divided by resistor 608 as shown in FIG. 6.

At step 804, Intat generator 602 may generate a current that is negatively proportional to absolute temperature, i.e., has a negative temperature coefficient. In some embodiments, Intat may be based on the Vbe of NPN 604 divided by resistor 609 as shown in FIG. 6.

At step 806, temperature compensation circuit 410 may subtract a first mirrored version of Iptat (D*Iptat) from a first mirrored version of Intat (C*Intat) to generate a first signal (Ineg_tc) having a negative temperature coefficient from a cold temperature to a median temperature.

At step 808, temperature compensation circuit 410 may subtract a second mirrored version of Intat (B*Intat) from a second mirrored version of Iptat (A*Iptat) to generate a second signal (Ipos_tc) having a positive temperature coefficient from a median temperature to a hot temperature.

At step 810, temperature compensation circuit 410 may multiply the first signal (Ineg_tc) by a first programmable ratio. In some embodiments, temperature compensation circuit 410 may perform the multiplication by mirroring a current equivalent to Ineg_tc with a programmable current mirror ratio implemented by programmable-PMOS 638.

At step 812, temperature compensation circuit 410 may multiply the second signal (Ipos_tc) by a second programmable ratio. In some embodiments, temperature compensation circuit 410 may perform the multiplication by mirroring Ipos_tc with a programmable current mirror ratio implemented by programmable-PMOS 631.

At step 814, temperature compensation circuit 410 may generate a temperature compensation output signal including a first programmable temperature coefficient from a cold temperature to a median temperature based at least on the first programmable ratio and a second programmable temperature coefficient from the median temperature to the hot temperature based at least on the second programmable ratio. In some embodiments, amplifier 560 may implement step 814 by combining the Vpre_tc signal at its positive input terminal with the Ipos_tc_prog signal injected into the negative feedback network at its negative input terminal.

Although FIG. 8 discloses a particular number of steps to be taken with respect to method 800, method 800 may be executed with greater or lesser steps than those depicted in FIG. 8. In addition, although FIG. 8 discloses a certain order of steps to be taken with respect to method 800, the steps comprising method 800 may be completed in any suitable order.

Although the present disclosure has been described with several embodiments, various changes and modifications may be suggested to one skilled in the art. It is intended that the present disclosure encompass such changes and modifications as fall within the scope of the appended claims.

What is claimed is:

1. A temperature compensation circuit, comprising:
    a temperature coefficient generator configured to generate a proportional-to-absolute-temperature (ptat) signal and a negatively-proportional-to-absolute-temperature (ntat) signal; and
    a programmable temperature-coefficient combiner configured to output a temperature compensation signal having combined temperature coefficient based on a first programmable temperature coefficient across a first temperature range and a second programmable temperature coefficient across a second temperature range, the first and second programmable temperature coefficients each based on the ptat signal and the ntat signal.

2. The temperature compensation circuit of claim 1, wherein the programmable temperature-coefficient combiner comprises:
    a first programmable element configured to output a first signal having the first programmable temperature coefficient across the first temperature range based on the ptat signal and the ntat signal;
    a second programmable element configured to output a second signal having the second programmable temperature coefficient across the second temperature range based on the ptat signal and the ntat signal; and
    an amplifier, the amplifier including a first input terminal driven by the first signal, a second input terminal driven by the second signal, and an output terminal driving the temperature compensation signal.

3. The temperature compensation circuit of claim 1, wherein the temperature coefficient generator comprises a bandgap circuit.

4. The temperature compensation circuit of claim 1, wherein:
    the ptat signal is a ptat current that is based at least on the difference between a first base-to-emitter voltage of a first bipolar junction transistor (BJT) having a first size and a second base-to-emitter voltage of a second BJT having a second size larger than the first size divided by a first resistor; and
    the ntat signal is an ntat current that is based at least on the first base-to-emitter voltage of the first BJT divided by a second resistor.

5. The temperature compensation circuit of claim 1, wherein:
    the first temperature range spans from a first temperature to a second temperature;
    the second temperature range spans from a third temperature to a fourth temperature; and
    the third temperature is approximately equal to the second temperature.

6. The temperature compensation circuit of claim 2, wherein:
    the first programmable element is configured to have a first programmable size determined by a first control input; and
    the second programmable element is configured to have a second programmable size determined by a second control input.

7. A phase-locked loop (PLL), comprising:
    a voltage controlled oscillator (VCO); and
    a temperature compensation circuit configured to generate a temperature compensation signal to control power supply to the VCO, the temperature compensation circuit comprising:
        a temperature coefficient generator configured to generate a proportional-to-absolute-temperature (ptat) signal and a negatively-proportional-to-absolute-temperature (ntat) signal; and
        a programmable temperature-coefficient combiner configured to output the temperature compensation signal having combined temperature coefficient based on a first programmable temperature coefficient across a first temperature range and a second programmable temperature coefficient across a second temperature range, the first and second programmable temperature coefficients each based on the ptat signal and the ntat signal.

8. The PLL of claim 7, wherein the programmable temperature-coefficient combiner comprises:
    a first programmable element configured to output a first signal having the first programmable temperature coefficient across the first temperature range based on the ptat signal and the ntat signal;
    a second programmable element configured to output a second signal having the second programmable temperature coefficient across the second temperature range based on the ptat signal and the ntat signal; and
    an amplifier, the amplifier including a first input terminal driven by the first signal, a second input terminal driven by the second signal, and an output terminal driving the temperature compensation signal.

9. The PLL of claim 7, wherein the temperature coefficient generator comprises a bandgap circuit.

10. The PLL of claim 7, wherein:
    the ptat signal is a ptat current that is based at least on the difference between a first base-to-emitter voltage of a first bipolar junction transistor (BJT) having a first size and a second base-to-emitter voltage of a second BJT having a second size larger than the first size divided by a first resistor; and
    the ntat signal is an ntat current that is based at least on the first base-to-emitter voltage of the first BJT divided by a second resistor.

11. The PLL of claim 7, wherein:
    the first temperature range spans from a first temperature to a second temperature;
    the second temperature range spans from a third temperature to a fourth temperature; and
    the third temperature is approximately equal to the second temperature.

12. The PLL of claim 7, wherein:
    the first programmable temperature coefficient is programmed to substantially offset a temperature coefficient of the VCO from the first temperature to the second temperature; and
    the second programmable temperature coefficient is programmed to substantially offset the temperature coefficient of the VCO from the third temperature to the fourth temperature.

13. The PLL of claim 8, wherein:
    the first programmable element is configured to have a first programmable size determined by a first control input; and the second programmable element is configured to have a second programmable size determined by a second control input.

14. The PLL of claim 13, wherein the PLL is configured to be tuned to a frequency range based at least on a coarse tune signal.

15. The PLL of claim 14, wherein the first control input is driven by a first control signal corresponding to the coarse tune signal, and the second control input is driven by a second control signal corresponding to the coarse tune signal.

16. A method, comprising:

generating a proportional-to-absolute-temperature (ptat) signal;

generating a negatively-proportional-to-absolute-temperature (ntat) signal; and generating a temperature compensation signal having a combined temperature coefficient based on a first programmable temperature coefficient across a first temperature range and a second programmable temperature coefficient across a second temperature range, the first and second programmable temperature coefficients each based on the ptat signal and the ntat signal.

17. The method of claim 16, further comprising:

generating a first signal having the first programmable temperature coefficient across the first temperature range based on the ptat signal and the ntat signal;

generating a second signal having the second programmable temperature coefficient across the second temperature range based on the ptat signal and the ntat signal; and combining the first signal and the second signal to output the temperature compensation signal having the combined temperature coefficient.

18. The method of claim 17, further comprising:

programming the first programmable temperature coefficient by setting a first programmable size of a first programmable element with a first control signal comprising at least a first bit; and programming the second programmable temperature coefficient by setting a second programmable size of a second programmable element with a second control signal comprising at least a second bit.

19. The method of claim 16, further comprising:

providing a regulated supply voltage to a voltage controlled oscillator (VCO) based at least on the temperature compensation signal; and offsetting a temperature coefficient of the VCO across the first temperature range and the second temperature range with the combined temperature coefficient of the temperature compensation signal.

20. The method of claim 16, wherein:

generating the ptat signal comprises generating a ptat current based on a bandgap circuit; and generating the ntat signal comprises generating an ntat current based on the bandgap circuit.

* * * * *